United States Patent
Bowers et al.

(10) Patent No.: US 10,199,793 B2
(45) Date of Patent: *Feb. 5, 2019

(54) METHOD AND SYSTEM FOR PUMPING OF AN OPTICAL RESONATOR

(71) Applicant: Elwha LLC, Bellevue, WA (US)

(72) Inventors: Jeffrey A. Bowers, Bellevue, WA (US); William D. Duncan, Sammamish, WA (US); Roderick A. Hyde, Redmond, WA (US); Jordin T. Kare, San Jose, CA (US); Nathan Kundtz, Kirkland, WA (US); Ruopeng Liu, Shenzhen (CN); Bruce M. McWilliams, Atherton, CA (US); John B. Pendry, Surrey (GB); Daniel A. Roberts, Melville, NY (US); David Schurig, Salt Lake City, UT (US); David R. Smith, Durham, NC (US); Clarence T. Tegreene, Mercer Island, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/639,642

(22) Filed: Jun. 30, 2017

(65) Prior Publication Data

US 2017/0302049 A1 Oct. 19, 2017

Related U.S. Application Data

(63) Continuation of application No. 15/183,017, filed on Jun. 15, 2016, now Pat. No. 9,698,558, which is a (Continued)

(51) Int. Cl.
*H01S 5/00* (2006.01)
*H01S 3/091* (2006.01)
(Continued)

(52) U.S. Cl.
CPC .......... *H01S 3/0912* (2013.01); *H01S 3/0092* (2013.01); *H01S 3/0604* (2013.01);
(Continued)

(58) Field of Classification Search
CPC ...... H01S 5/105; H01S 5/0604; H01S 5/4031; H01S 5/1021; H01S 5/10; H01S 3/0092; H01S 3/108; H01S 3/0912; H01S 3/0604
See application file for complete search history.

(56) References Cited

U.S. PATENT DOCUMENTS

| 5,999,308 | A | * | 12/1999 | Nelson | B82Y 20/00 359/237 |
| 7,072,555 | B1 | * | 7/2006 | Figotin | B82Y 20/00 385/129 |

(Continued)

OTHER PUBLICATIONS

Andrew and Barnes, "Energy Transfer Across a Metal Film Mediated by Surface Plasmon Polaritons", Science, Nov. 5, 2004, vol. 306, pp. 1002-1005.
(Continued)

*Primary Examiner* — Kinam Park
(74) *Attorney, Agent, or Firm* — Foley & Lardner LLP

(57) ABSTRACT

A method of pumping an optical resonator includes directing light generated by a pumping light at the optical resonator, exciting a propagating surface state of the optical resonator at an interface of the optical resonator, and changing a propagating frequency of the light proximate the interface, where the changed frequency corresponds to a propagation frequency of the surface state. The optical resonator includes a photonic crystal and a material, where the interface is formed between the photonic crystal and the material.

20 Claims, 7 Drawing Sheets

Related U.S. Application Data continuation of application No. 14/684,144, filed on Apr. 10, 2015, now Pat. No. 9,385,503, which is a continuation of application No. 13/941,341, filed on Jul. 12, 2013, now Pat. No. 9,048,621.

(51) Int. Cl.
  *H01S 5/10* (2006.01)
  *H01S 5/06* (2006.01)
  *H01S 5/40* (2006.01)
  *H01S 3/06* (2006.01)
  *H01S 3/00* (2006.01)
  *H01S 3/108* (2006.01)

(52) U.S. Cl.
  CPC ............ H01S 3/108 (2013.01); H01S 5/0604 (2013.01); H01S 5/10 (2013.01); H01S 5/105 (2013.01); H01S 5/1021 (2013.01); H01S 5/4031 (2013.01); *G02F 2202/32* (2013.01)

(56) References Cited

U.S. PATENT DOCUMENTS

| | | |
|---|---|---|
| 7,995,879 B2 | 8/2011 | Bowers et al. |
| 9,698,558 B2* | 7/2017 | Bowers ................. H01S 3/0092 |
| 2008/0240543 A1 | 10/2008 | Budach et al. |
| 2008/0278722 A1 | 11/2008 | Cunningham et al. |
| 2009/0116525 A1* | 5/2009 | Shchukin .................. H01S 5/10 |
| | | 372/45.01 |
| 2010/0289408 A1* | 11/2010 | Madey ................... H04B 10/70 |
| | | 315/39.51 |

OTHER PUBLICATIONS

Hakala et al., "Frequency conversion of propagating surface plasmon polaritons by organic molecules", Applied Physics Letters 93, 123307, 2008, 4 pages.

* cited by examiner

METHOD AND SYSTEM FOR PUMPING OF AN OPTICAL RESONATOR

CROSS-REFERENCE TO RELATED PATENT APPLICATIONS

The present application is a continuation of U.S. patent application Ser. No. 15/183,017, filed Jun. 15, 2016, which is a continuation of U.S. patent application Ser. No. 14/684,144, filed Apr. 10, 2015, which is a continuation of U.S. patent application Ser. No. 13/941,341, filed Jul. 12, 2013, the entire disclosures of which are incorporated herein by reference in their entireties for any and all purposes.

BACKGROUND

Photonic crystals are optical structures including a periodic arrangement of a dielectric or metallo-dielectric material. The periodic arrangement exhibits a strong interaction with light, and affects the propagation of electromagnetic waves (EM) in a manner analogous to the way the periodic potential in a semiconductor crystal affects electron motion. The periodic arrangement defines allowed photon propagation bands and forbidden photon propagation bandgaps. Optical pumping is a process in which light is used to excite the medium or some of its constituents into other energy levels. Typically electrons are raised from a lower energy level in an atom or molecule to a higher one.

SUMMARY

One embodiment relates to a method of pumping an optical resonator. The method includes directing light generated by a pumping light at the optical resonator, exciting a propagating surface state of the optical resonator at an interface of the optical resonator, and changing a propagating frequency of the light proximate the interface, where the changed frequency corresponds to a propagation frequency of the surface state. The optical resonator includes a photonic crystal and a material, where the interface is formed between the photonic crystal and the material.

Another embodiment relates to a non-transitory computer-readable medium having instructions stored thereon, the instructions form a program executable by a processing circuit to control pumping an optical resonator. The instructions include instructions to control generation of light by a pumping light source, instructions to control directing light at the optical resonator, instructions to monitor excitation of a propagating surface state of the optical resonator at the interface of the optical resonator, and instructions to monitor a change in a propagating frequency of the light proximate the interface, where the changed frequency corresponds to a propagation frequency of the surface state. The light is generated by the pumping light source, and the optical resonator includes a photonic crystal and a material, where an interface is formed between the photonic crystal and the material.

Another embodiment relates to a system for pumping an optical resonator, including a controllable pumping light source configured to generate light and direct light at the optical resonator. The optical resonator includes a photonic crystal and a material, where an interface is formed between the photonic crystal and the material. The system further includes a processing circuit configured to control generation of light by a pumping light source, control directing light at the optical resonator, monitor excitation of a propagating surface state of the optical resonator at the interface of the optical resonator, and monitor a change in a propagating frequency of the light proximate the interface, where the changed frequency corresponds to a propagation frequency of the surface state.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
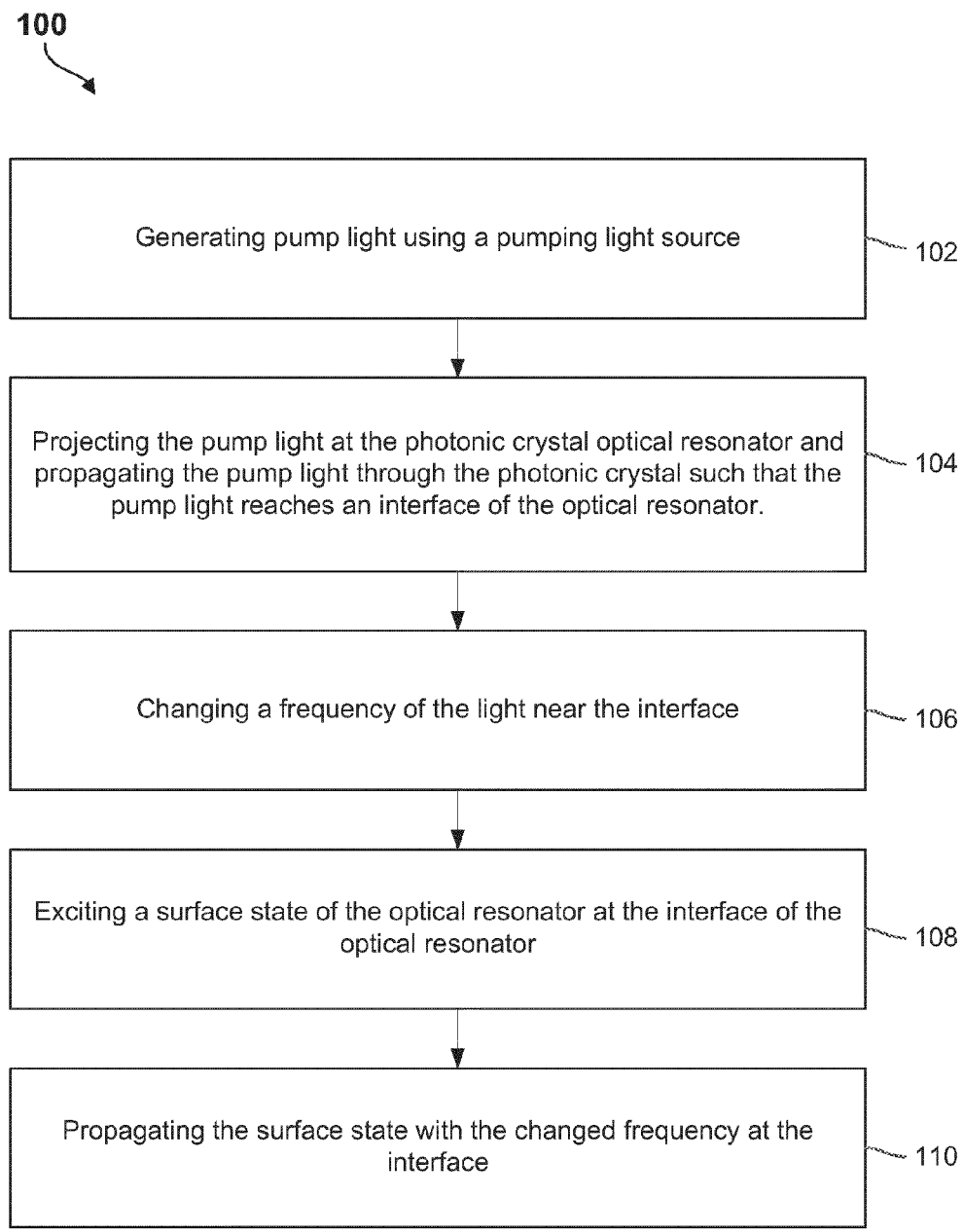
FIG. 1 is a flowchart of a process for pumping an optical resonator according to an embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring generally to the figures, various embodiments for a method of pumping an optical resonator are shown and described. Photonic crystals are periodic nanostructures of materials with differing refractive indices that affect the propagation of photons therethrough. Photonic crystals are described in E. Yablonovitch, Photonic Crystals: Semiconductors Of Light, Scientific American, December 2001, Volume 285, Number 6, pages 47-55, which is incorporated herein by reference. Periodic variations of the crystal structure may be one-dimensional, two-dimensional, or three-dimensional variations, as needed for a particular application, as described in Yablonovitch. Photonic crystals may also be used to construct optical resonator devices which are spectrally limited (i.e. limited by the photonic crystals or limited in chromatic index). Because of the periodic structure of a photonic crystal, the propagation of certain light frequencies therethrough may be inhibited, resulting in bandgaps corresponding to the inhibited frequencies. Only certain modes of light can propagate through the photonic crystal based on allowed frequencies.

Figure 7:
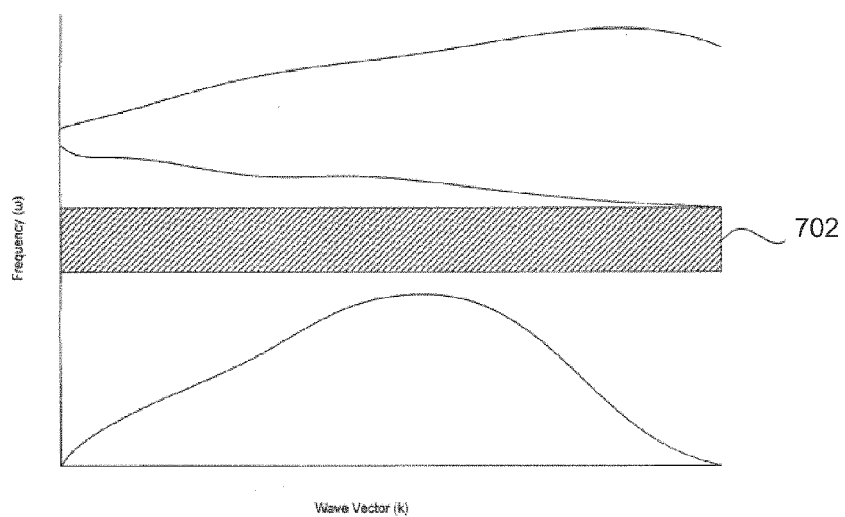
FIG. 7 is a band gap diagram according to an embodiment.

A photonic crystal also has a surface state where waves of certain modes may propagate. A surface state may exist on a dielectric-dielectric interface where one of the dielectrics has a negative, or effectively negative, permittivity. For example, where one or both of the dielectrics is a material having a band gap (e.g., an optical resonator comprised of a photonic crystal, etc.), a surface state may exist at the interface between the photonic crystal and the other dielectric in the forbidden energy bands of the photonic crystal. Such surface states are described in Robert D. Meade, Karl D. Brommer, Andrew M. Rappe, and J. D. Joannopoulos, *Electromagnetic Bloch Waves at the Surface of a Photonic Crystal*, Physical Review B, Vol 44, 10961 (1991), which is incorporated herein by reference. Such an interface may be between a photonic crystal and another material (e.g., a metal, a dielectric, another photonic crystal, a different material, a gas, the air, vacuum, etc.). The bandgap at the interface may be a complete bandgap (i.e., all wave vectors are blocked) or may be an incomplete bandgap (i.e. only partial wave vector ranges are blocked). A band gap diagram with an band gap 702 is shown in FIG. 7. A photonic crystal may also guide surface states as described in A. I. Rahachou and I. V. Zozoulenko, *Waveguiding Properties Of Surface States In Photonic Crystals*, Linkoping University, Department of Science and Technology, bearing a date of Oct. 31, 2005, pages 1-4, which is incorporated herein by reference. Because a surface state is confined to within a limited range of the photonic crystal's interface, with its modal envelope decaying rapidly away from the interface, surface states have similar confinement and surface propagation characteristics as plasmons. However, since they can exist in purely dielectric materials, without the absorption associated with metals, surface states can provide longer lifetimes and greater propagation distances than plasmons, offering an advantage in technological applications.

Optical pumping may be used to transfer energy from an external pumping source (e.g., an optical source, a laser, out-of-band light, etc.) into a structure consisting of photonic crystals. In one embodiment, the pumping source supplies light. However, because a surface state exists within a frequency bandgap of the photonic crystal bordered system, it is difficult for such an externally propagating pumping light to excite electromagnetic surface state waves. In an embodiment, excitation of the surface state is achieved by changing the frequency of the light from that of the pumping light to a frequency within the bandgap at which the surface state exists and propagates. The pump light propagates through the photonic crystal or the other material forming the interface until it reaches the vicinity of the interface as described above. At this point the pump light undergoes a nonlinear interaction with the material (either that of the photonic crystal, that of the other material forming the interface, or that of another material near the interface) and changes its frequency to one within the bandgap at which the surface state exists and propagates. The excitation may then propagate as a surface state along the surface of the photonic crystal (i.e. along the interface). In the case of an interface with a partial bandgap as described above, the frequency converted pump light ideally has wave vectors within the partial bandgap (i.e., non-propagating wave vectors).

Various methods exist for frequency conversion. According to an embodiment, a coherent, nonlinear pumping process is used to change the frequency of the pump light and excite a surface state. The nonlinear frequency conversion takes place in a nonlinear optical material, which may be inorganic (e.g., lithium niobate, potassium dihydrogen phosphate), or which may be organic (e.g., L-arginine maleate dihydrate). In an embodiment, the nonlinear material is a component of the photonic crystal. In an embodiment, the nonlinear optical material is included in the other material forming the interface with the photonic crystal. In another embodiment, the nonlinear optical material is not at the interface, but is close nearby, such that it is within the modal envelope of the surface state. Nonlinear frequency conversion processes and materials are described in *Fundamentals of Nonlinear Optics*, by Peter E. Powers, ISBN 978-1420093513 (2011), which is incorporated herein by reference. As one example, the process is based on Raman scattering techniques. As another example, the process is based on harmonic generation. As another example, the process is based on frequency sum or difference mixing. As another example, the process is based on an electro-optic effect. As another example, the process is based on coherent multi-photon absorption, in which two or more photons are coherently absorbed into an excited state which then radiates at the surface state frequency.

According to an embodiment, a non-coherent pumping process is used to change the frequency of the pump light and excite a surface state. As one example, the process is based on fluorescence. As another example, the process is based on photon upconversion. Such photon upconversion may involve sequential upconversion, in which a first photon is absorbed into a relatively long-lived excited state, which then (before it decays) absorbs another photon causing excitation into a higher excited state, which then radiates at the surface state frequency.

Referring to FIG. 1, a flow diagram of a process 100 for pumping an optical resonator, is shown, according to an embodiment. In alternative embodiments, fewer, additional, and/or different steps may be performed. Also, the use of a flow diagram is not meant to be limiting with respect to the order of steps performed. Process 100 includes generating pump light using a pumping light source (102), projecting the pump light at the photonic crystal (1D, 2D, or 3D) optical resonator and propagating the pump light through the photonic crystal such that the pump light reaches an interface of the optical resonator (104). The interface may be between photonic crystal and another material (e.g., a metal, a dielectric, another photonic crystal, a gas, the air, vacuum, etc.). Process 100 further includes changing a frequency of the light near/proximate the interface (106), exciting a surface state of the optical resonator at the interface of the optical resonator (108), and propagating the surface state with the changed frequency at the interface (110).

Figure 2:
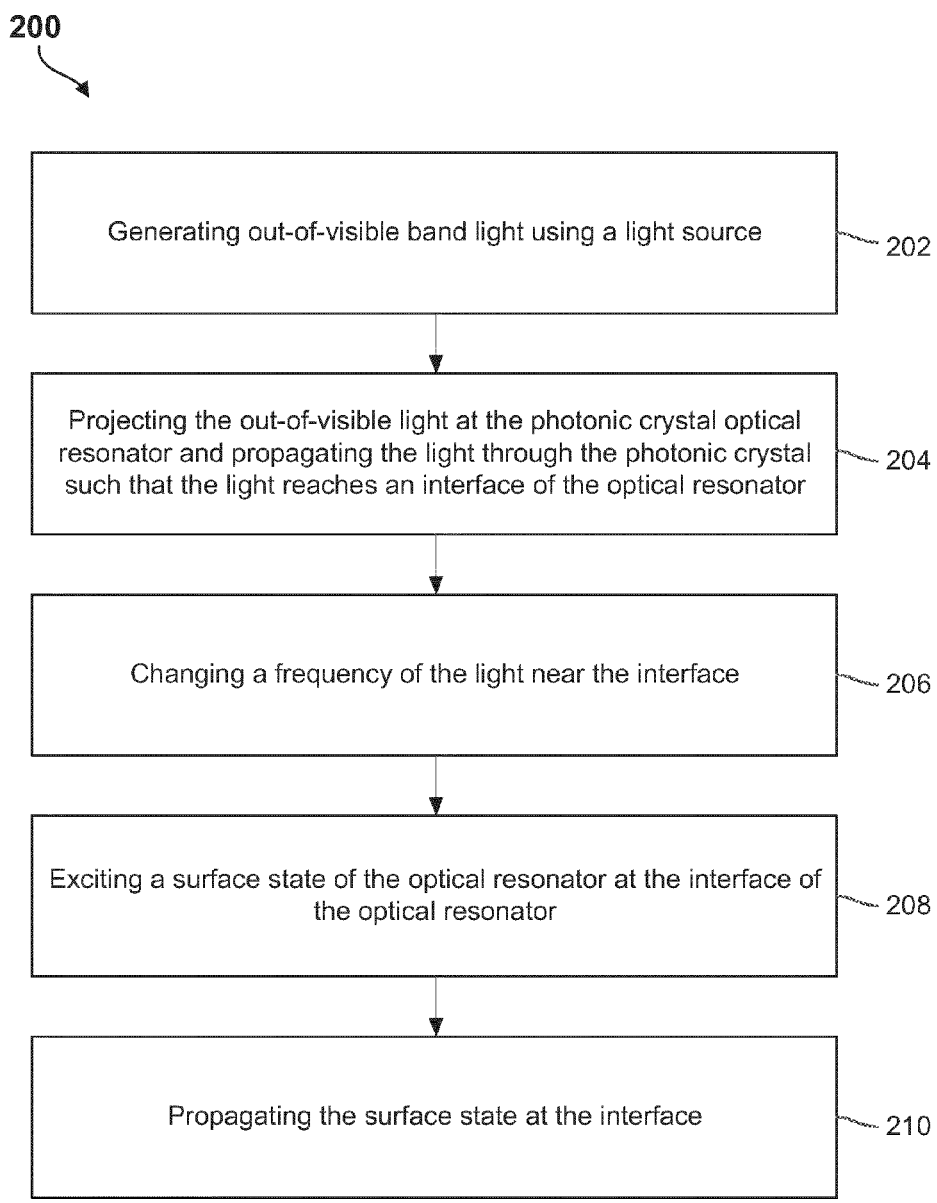
FIG. 2 is a flowchart of a process for pumping an optical resonator according to an embodiment.

Referring to FIG. 2, a flow diagram of a process 200 for pumping an optical resonator, is shown, according to an embodiment. In alternative embodiments, fewer, additional, and/or different steps may be performed. Also, the use of a flow diagram is not meant to be limiting with respect to the order of steps performed. Process 200 includes generating out-of-visible band light using a light source (202), projecting the out-of-visible light at the photonic crystal optical resonator and propagating the light through the photonic crystal such that the light reaches an interface of the optical resonator (204), changing a frequency of the light near the interface (206), exciting a surface state of the optical resonator at the interface of the optical resonator (208), and propagating the surface state at the interface (210).

Figure 3:
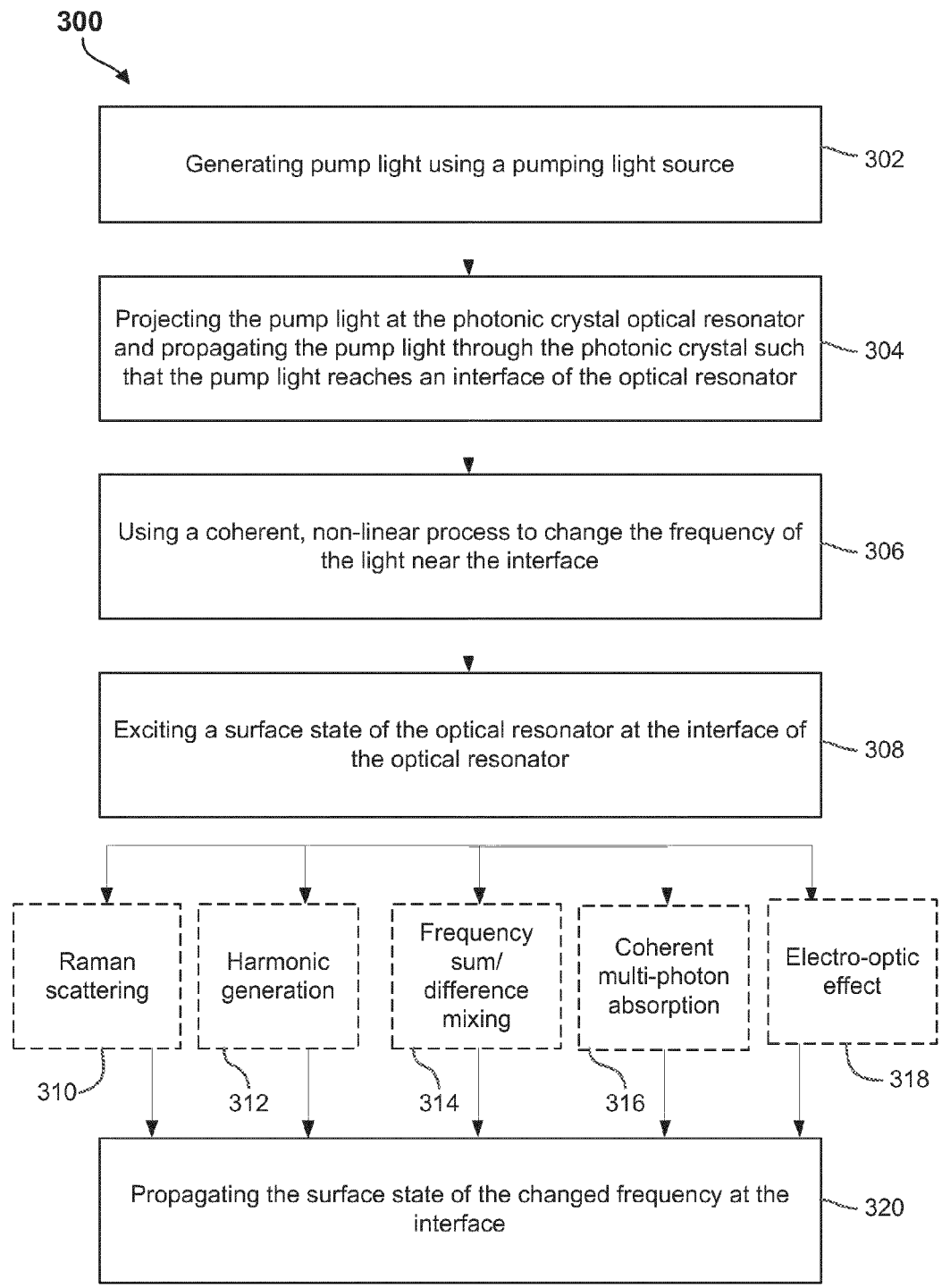
FIG. 3 is a flowchart of a process for pumping an optical resonator according to an embodiment.

Referring to FIG. 3, a flow diagram of a process 300 for pumping an optical resonator, is shown, according to an embodiment. In alternative embodiments, fewer, additional, and/or different steps may be performed. Also, the use of a flow diagram is not meant to be limiting with respect to the order of steps performed. Process 300 includes generating pump light using a pumping light source (302), projecting the pump light at the photonic crystal optical resonator and propagating the pump light through the photonic crystal such that the pump light reaches an interface of the optical resonator (304), using a coherent, non-linear process to change the frequency of the light near the interface (306), exciting a surface state of the optical resonator at the interface of the optical resonator (308). The coherent, non-linear process may be based on Raman scattering (310), harmonic generation (312), frequency sum or difference mixing (314), coherent multi-photon absorption (316), or an electro-optic effect (318). Process 300 further includes propagating the surface state of the changed frequency at the interface (320).

Figure 4:
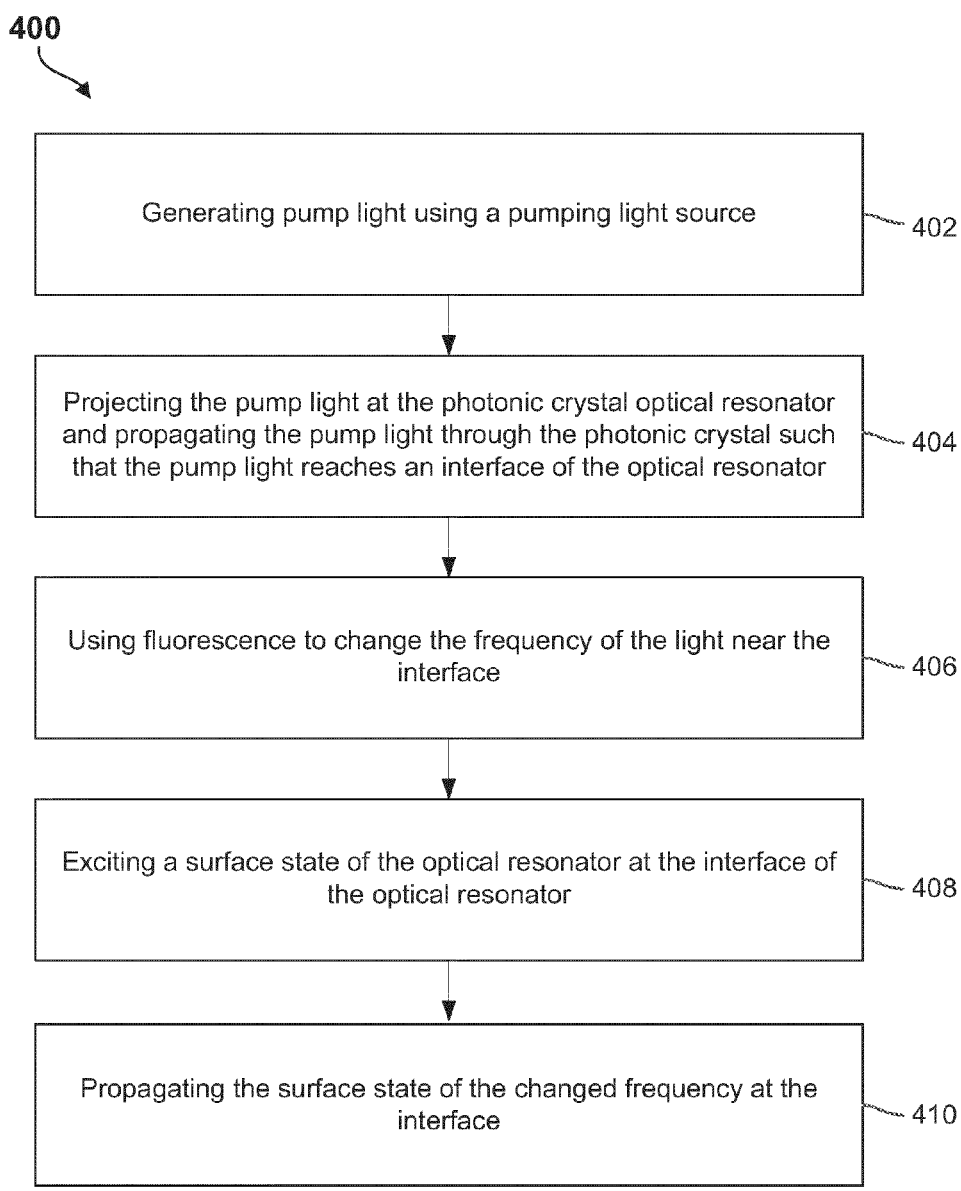
FIG. 4 is a flowchart of a process for pumping an optical resonator according to an embodiment.

Referring to FIG. 4, a flow diagram of a process 400 for pumping an optical resonator, is shown, according to an embodiment. In alternative embodiments, fewer, additional, and/or different steps may be performed. Also, the use of a flow diagram is not meant to be limiting with respect to the order of steps performed. Process 400 includes generating pump light using a pumping light source (402), projecting the pump light at the photonic crystal optical resonator and propagating the pump light through the photonic crystal such that the pump light reaches an interface of the optical resonator (404), using fluorescence to change the frequency of the light near the interface (406), exciting a surface state of the optical resonator at the interface of the optical resonator (408), and propagating the surface state of the changed frequency at the interface (410).

Figure 5:
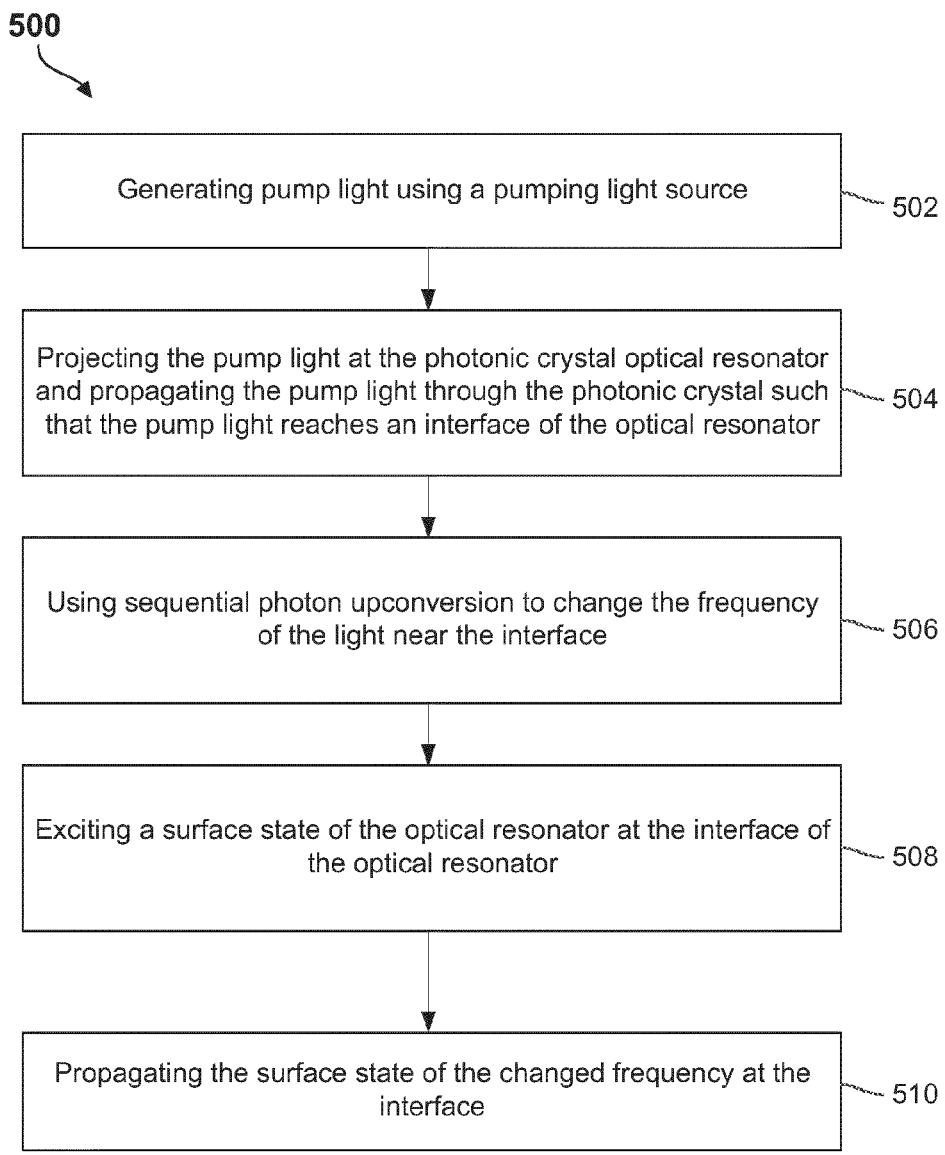
FIG. 5 is a flowchart of a process for pumping an optical resonator according to an embodiment.

Referring to FIG. 5, a flow diagram of a process 500 for pumping an optical resonator, is shown, according to an embodiment. In alternative embodiments, fewer, additional, and/or different steps may be performed. Also, the use of a flow diagram is not meant to be limiting with respect to the order of steps performed. Process 500 includes generating pump light using a pumping light source (502), projecting the pump light at the photonic crystal optical resonator and propagating the pump light through the photonic crystal such that the pump light reaches an interface of the optical resonator (504), using sequential photon upconversion to change the frequency of the light near the interface (506), and exciting a surface state of the optical resonator at the interface of the optical resonator (508). Process 500 further includes propagating the surface state of the changed frequency at the interface (510).

Figure 6:
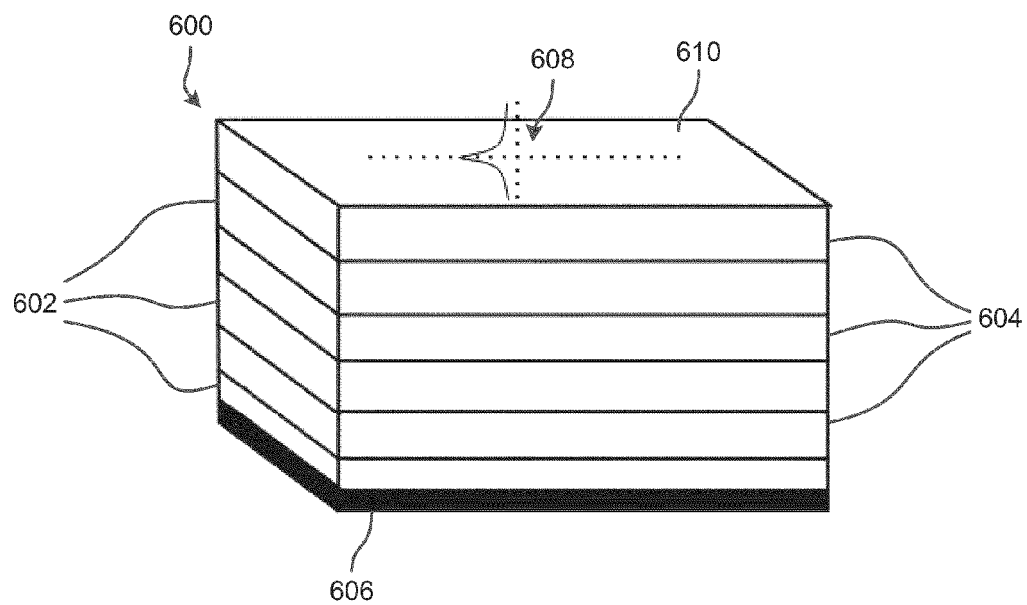
FIG. 6 is a schematic diagram of a photonic crystal structure according to an embodiment.

Referring to FIG. 6, a photonic crystal structure 600 is shown according to an embodiment. Photonic crystal structure 600 may be an optical resonator, and is shown as including a 1D photonic crystal comprising layers of a first material 602 and a second material 604 fabricated on a substrate 606. Examples of 1D photonic crystals are given in Yablonovitch and in Y. Fink, J. N. Winn, S. Fan, C. Chen, J. Michel, J. D. Joannopoulos, and E. L. Thomas, *A Dielectric Omnidirectional Reflector*, Science, Nov. 27, 1998, Volume 282, pages 1679-1682, which is incorporated herein by reference. Although shown as a 1D photonic crystal, in other embodiments photonic crystal structure 600 may be a 2D or 3D photonic crystal structure, and may have variations analogous to those described below.

Although the photonic crystal structure 600 is shown having alternating layers, where the layers have substantially equal thicknesses, the layer thicknesses and materials of 602 and 604 may be chosen and varied according to the design of the photonic crystal structure 600. For example, the design of photonic crystal structure 600 may be such that the layer thicknesses are configured to vary, the layer thicknesses may vary slightly due to fabrication imperfections, the structure may include a top layer having a thickness inconsistent with the periodicity of the remainder of photonic crystal structure 600, and/or there may be other reasons for variations in the layer thicknesses. Although photonic crystal structure 600 is shown including two different materials it may include more than two types of materials. Further, although photonic crystal structure 600 is shown having six layers in FIG. 6, it may have a different number of layers.

FIG. 6 further shows surface state 608 at interface 610 of photonic crystal structure 600. The material or structure (not shown) forming interface 610 with photonic crystal structure 600 may be air, vacuum, or its equivalent, a dielectric material, another photonic crystal structure, a metal, or a different material or structure. Interface 610, although shown as being substantially continuous and planar, may have a different shape. In an embodiment, surface state 608 includes substantially exponential functions with a field maximum at interface 610. In another embodiment, surface state 608 includes only approximately exponential functions. Surface state 608 may also be described by a different function, and/or may have a field maximum someplace other than interface 610. Further, although surface state 608 is shown at a certain location on photonic crystal structure 600 for illustrative purposes, the spatial distribution of surface state 608 may vary. In an embodiment, surface state 608 may be excited by methods as described herein in order to change the frequency of light at the interface 610. After the frequency has changed, the surface state 608 may propagate along interface 610 of photonic crystal structure 600.

Figure 8:
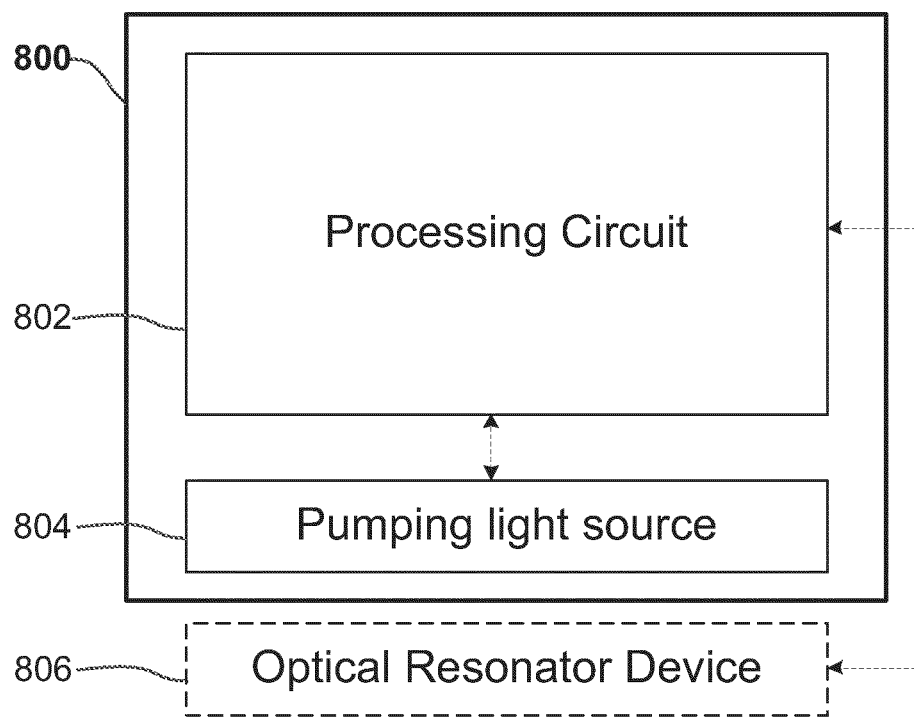
FIG. 8 is block diagram of a system for pumping an optical resonator according to an embodiment.

Referring to FIG. 8, a block diagram of a system 800 for pumping optical resonator device 806 is shown according to an embodiment. System 800 includes processing circuit 802 and pumping light source 804. Processing circuit 802 includes all components necessary to control and monitor pumping light source 804 (e.g., processor(s), memory, buffer(s), input(s), output(s), peripherals, storage, circuit boards, etc.) and to monitor feedback provided by sensors configured to monitor optical resonator device 806. In one embodiment, processing circuit 802 includes the processing components of a computing device (e.g., a computer, a laboratory device, etc.). Pumping light source 804 includes all components necessary to generate and direct light at optical resonator device 806. In one embodiment, pumping light source 804 includes a controllable pump laser (e.g., a diode laser, a solid state laser, a liquid dye laser, a discharge lamp, etc.). Pumping light source 804 may be communicably connected to processing circuit 802. Optical resonator device 806 may be include a resonator constructed from photonic crystals. Optical resonator device 806 may also include sensors configured to provide feedback related to an optical pumping process. The sensors may be communicable connected to processing circuit 802 and the feedback may be utilized by processing circuit 802 in implemented the processes described herein.

According to one embodiment, processing circuit 802 includes a processor. The processor may be implemented as a general-purpose processor, an application specific integrated circuit (ASIC), one or more field programmable gate arrays (FPGAs), a group of processing components, or other suitable electronic processing components. Processing circuit 802 may also include a memory. The memory may include one or more devices (e.g., RAM, ROM, Flash Memory, hard disk storage, etc.) for storing data and/or computer code for facilitating the various processes described herein. The memory may be or include non-transient volatile memory or non-volatile memory. The memory may include database components, object code components, script components, or any other type of information structure for supporting the various activities and information structures described herein. The memory may be communicably connected to the processor and include computer code or instructions for executing the processes described herein (e.g., the processes shown in FIGS. 1-5). In implementing the processes described herein, processing circuit 802 may make use of machine learning, artificial intelligence, interactions with databases and database table lookups, pattern recognition and logging, intelligent control, neural networks, fuzzy logic, etc.

The construction and arrangement of the systems and methods as shown in the various embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for pumping an optical resonator, comprising:
   generating light using a light source;
   projecting the light at the optical resonator;
   propagating the light through a photonic crystal such that the light reaches an interface of the optical resonator;
   changing a frequency of the light near the interface;
   exciting a surface state of the optical resonator at the interface; and
   propagating the surface state at the interface.

2. The method of claim 1, wherein the optical resonator is a spectrally limited optical resonator, wherein the spectrally limited optical resonator is limited in chromatic index.

3. The method of claim 1, wherein the photonic crystal is one-dimensional, two-dimensional, or three-dimensional.

4. The method of claim 1, wherein the interface is between the photonic crystal and a metal, a dielectric, another photonic crystal, a gas, air, or vacuum.

5. The method of claim 1, wherein the surface state includes substantially exponentially functions with a field maximum at the interface.

6. The method of claim 1, wherein the surface state propagates along the interface after the frequency of the light is changed.

7. The method of claim 1, wherein the optical resonator includes alternating layers having substantially equal thickness, wherein the photonic crystal includes at least one layer of the alternating layers.

8. A non-transitory computer-readable medium having instructions stored thereon, the instructions forming a program executable by a processing circuit to control pumping an optical resonator, the instructions comprising:
   instructions to control generation of light using a light source;
   instructions to control projection of the light at the optical resonator;
   instructions to excite propagation of the light through a photonic crystal such that the light reaches an interface of the optical resonator;
   instructions to monitor a change of a frequency of the light near the interface;
   instructions to monitor excitation of a surface state of the optical resonator at the interface; and
   instructions to monitor propagation of the surface state at the interface.

9. The non-transitory computer-readable medium of claim 8, wherein the optical resonator is a spectrally limited optical resonator, wherein the spectrally limited optical resonator is limited in chromatic index.

10. The non-transitory computer-readable medium of claim 8, wherein the photonic crystal is one-dimensional, two-dimensional, or three-dimensional.

11. The non-transitory computer-readable medium of claim 8, wherein the interface is between the photonic crystal and a metal, a dielectric, another photonic crystal, a gas, air, or vacuum.

12. The non-transitory computer-readable medium of claim 8, wherein the surface state includes substantially exponentially functions with a field maximum at the interface.

13. The non-transitory computer-readable medium of claim 8, wherein the surface state propagates along the interface after the frequency of the light is changed.

14. The non-transitory computer-readable medium of claim 8, wherein the optical resonator includes alternating layers having substantially equal thickness, wherein the photonic crystal includes at least one layer of the alternating layers.

15. A system for pumping an optical resonator, comprising:
   a controllable pumping light source configured to:
      generate light;
      project the light at the optical resonator, wherein the optical resonator comprises:
      a photonic crystal; and
      a material, wherein an interface is formed between the photonic crystal and the material; and
   a processing circuit configured to:
      control the generation of the light by the pumping light source;
      control the direction of the light by the pumping light source;
      monitor excitation of a propagating surface state of the optical resonator at the interface of the optical resonator; and
      monitor a change in a propagating frequency of the light at the interface.

16. The system of claim 15, wherein the optical resonator is a spectrally limited optical resonator, wherein the spectrally limited optical resonator is limited in chromatic index.

17. The system of claim 15, wherein the photonic crystal is one-dimensional, two-dimensional, or three-dimensional.

18. The system of claim 15, wherein the material includes a metal, a dielectric, another photonic crystal, a gas, air, or vacuum.

19. The system of claim 15, wherein the surface state includes substantially exponentially functions with a field maximum at the interface.

20. The system of claim 15, wherein the surface state propagates along the interface after the frequency of the light is changed.

* * * * *